United States Patent
Alvarez Guevara et al.

(10) Patent No.: US 9,842,608 B2
(45) Date of Patent: Dec. 12, 2017

(54) AUTOMATIC SELECTIVE GAIN CONTROL OF AUDIO DATA FOR SPEECH RECOGNITION

(71) Applicant: Google Inc., Mountain View, CA (US)

(72) Inventors: Raziel Alvarez Guevara, Menlo Park, CA (US); Preetum Nakkiran, Redmond, WA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/727,741

(22) Filed: Jun. 1, 2015

(65) Prior Publication Data

US 2016/0099007 A1      Apr. 7, 2016

Related U.S. Application Data (60) Provisional application No. 62/059,524, filed on Oct. 3, 2014.

(51) Int. Cl.
| | |
|---|---|
| *G10L 21/034* | (2013.01) |
| *G10L 25/78* | (2013.01) |
| *H03G 3/30* | (2006.01) |

(52) U.S. Cl.
CPC ......... *G10L 21/034* (2013.01); *H03G 3/3005* (2013.01); *G10L 25/78* (2013.01)

(58) Field of Classification Search
CPC ...... G10L 21/034; G10L 25/78; H03G 3/3005
See application file for complete search history.

(56) References Cited

U.S. PATENT DOCUMENTS

| | | | |
|---|---|---|---|
| 5,146,504 A * | 9/1992 | Pinckley | H03G 3/3089 381/104 |
| 6,314,396 B1 * | 11/2001 | Monkowski | G10L 15/20 704/233 |
| 6,615,170 B1 | 9/2003 | Liu et al. | |
| 7,454,331 B2 | 11/2008 | Vinton et al. | |
| 8,131,543 B1 | 3/2012 | Weiss et al. | |
| 8,554,560 B2 | 10/2013 | Valsan | |
| 2002/0120440 A1 * | 8/2002 | Zhang | G10L 25/78 704/215 |
| 2006/0018457 A1 * | 1/2006 | Unno | H04M 9/082 379/388.04 |

(Continued)

OTHER PUBLICATIONS

Wikipedia, "Maximum likelihood: Continuous distribution, continuous parameter space," May 18, 2015 [retrieved on May 27, 2015]. Retrieved from the Internet: URL<http://en.wikipedia.org/wiki/Maximum_likelihood#Continuous_distribution.2C_continuous_parameter_space>, 11 pages.

*Primary Examiner* — Walter Yehl
(74) *Attorney, Agent, or Firm* — Fish & Richardson P.C.

(57) ABSTRACT

This specification describes, among other things, a computer-implemented method. The method can include receiving a stream of audio data at a computing device. The stream of audio data can be segmented into a plurality of audio segments. Respective intensity levels are determined for each of the plurality of audio segments. For each of the plurality of audio segments and based on the respective intensity levels, a determination can be made as to whether the audio segment includes a speech signal. Selective gain control can be performed on the stream of audio data by automatically adjusting a gain of particular ones of the plurality of audio segments that are determined to include a speech signal.

20 Claims, 5 Drawing Sheets

(56) References Cited

U.S. PATENT DOCUMENTS

| | | | |
|---|---|---|---|
| 2006/0206320 A1* | 9/2006 | Li | G10L 21/0208 704/226 |
| 2007/0217627 A1* | 9/2007 | Ghanekar | H03G 3/3089 381/104 |
| 2008/0215322 A1* | 9/2008 | Fischer | G10L 15/063 704/243 |
| 2011/0202340 A1* | 8/2011 | Ariyaeeinia | G10L 17/20 704/233 |
| 2012/0123769 A1* | 5/2012 | Urata | H03G 3/3089 704/225 |
| 2012/0316875 A1* | 12/2012 | Nyquist | G10L 15/30 704/235 |
| 2014/0156575 A1* | 6/2014 | Sainath | G06N 7/005 706/16 |

* cited by examiner

AUTOMATIC SELECTIVE GAIN CONTROL OF AUDIO DATA FOR SPEECH RECOGNITION

RELATED CASES

This application claims benefit of U.S. Provisional Appl. No. 62/059,524, filed Oct. 3, 2014, which is herein incorporated by reference in its entirety.

TECHNICAL FIELD

This specification generally relates to speech recognition.

BACKGROUND

With the proliferation of mobile devices, such as smartphones, speech-enabled technologies are becoming increasingly widespread. Services such as GOOGLE voice search and conversational assistants such as GOOGLE NOW prominently feature speech-enabled technologies as a means of interacting with and controlling devices. Efforts have been made to improve the accuracy of speech-enabled technologies.

SUMMARY

This specification discusses techniques to improve robustness of small-footprint keyword spotting models based on deep neural networks (DNNs). Keyword spotting systems (KWS) that employ keyword spotting models can be trained to detect specific words or phrases spoken by a user. In some implementations, keyword spotting systems can run in an "always-on" fashion on mobile devices: continuously monitoring incoming audio, and responding appropriately to the user when a dialog is initiated by speaking a specific keyword. In view of the constraints imposed by some systems (e.g., mobile devices), the techniques described herein can result in a smaller memory and CPU footprint of a KWS system, while simultaneously providing high performance in terms of false alarm (FA) and false reject (FR) rates. In some implementations, a KWS system is trained in a multi-style manner to improve robustness to background noise. Training instances are generated by artificially adding in noise to simulate expected test conditions. When used in the context of learning the parameters of a DNN, this approach can result in the trained DNN having improved robustness in the presence of noisy inputs. Furthermore, an automatic gain control (AGC) technique is described that can selectively boost signal levels based on an estimate of whether or not the signal contains speech.

In some implementations, a computer-implemented method can include receiving a stream of audio data at a computing device. The stream of audio data can be segmented into a plurality of audio segments of length C. Respective intensity levels can be determined for each of the plurality of audio segments. For each of the plurality of audio segments and based on the respective intensity levels, a determination can be made as to whether the audio segment includes a speech signal. Selective gain control can be performed on the stream of audio data by automatically adjusting a gain of particular ones of the plurality of audio segments that are determined to include a speech signal.

These and other implementations can include one or more of the following features. Performing selective gain control on the stream of audio data can include adjusting the gain of the audio segments that are determined to include a speech signal without adjusting a gain of the audio segments that are determined to not include a speech signal.

Performing the selective gain control on the stream of audio data can include, for each of the plurality of audio segments: selecting a set of gain control rules that indicate a manner in which a gain of the audio segment is to be adjusted or that indicate that the gain of the audio segment is not to be adjusted, wherein the set of gain control rules are selected based at least on whether the audio segment is determined to include a speech signal; and applying the selected set of gain control rules to the audio segment.

The set of gain control rules can include one or more rules.

The length C of each of the plurality of audio segments can be in the range 80-120 milliseconds.

Segmenting the stream of audio data into the plurality of audio segments of length C can include segmenting the stream of audio data into a plurality of consecutive, non-overlapping segments of audio data of uniform length C.

Determining respective intensity levels for each of the plurality of audio segments can include, for each of the plurality of audio segments, designating a peak signal level of the audio segment as the intensity level of the audio segment.

Determining whether each of the plurality of audio segments includes a speech signal can include using the respective intensity level for each audio segment to differentiate among audio segments that include only noise and audio segments that include speech.

Speech recognition can be performed on at least a portion of the selectively gain controlled stream of audio data.

The at least portion of the selectively gain controlled stream of audio data can include audio segments that are determined to include a speech signal.

Performing speech recognition can include performing keyword spotting by determining whether the at least portion of the selectively gain controlled stream of audio data includes speech for one or more of a plurality of pre-defined keywords.

Performing speech recognition can include using a neural network to transcribe speech in the at least portion of the selectively gain controlled stream of audio data, or to identify that one or more pre-defined keywords are included in speech in the at least portion of the selectively gain controlled stream of audio data.

The neural network can be configured to perform keyword spotting for the one or more pre-defined keywords. The neural network can be trained at least in part on speech samples in which background noise is added to the speech samples.

The neural network can include a low-rank input layer of nodes.

The computing device can include a smartphone, a tablet computing device, a desktop computer, or a notebook computer.

Some implementations include one or more non-transitory computer-readable storage media having instructions stored thereon that, when executed by one or more processors, cause performance of operations. The operations can include receiving a stream of audio data at a computing device; segmenting the stream of audio data into a plurality of audio segments of length C; determining respective intensity levels for each of the plurality of audio segments; determining, for each of the plurality of audio segments and based on the respective intensity levels, whether the audio segment includes a speech signal; and performing selective gain control on the stream of audio data by automatically adjusting a gain of particular ones of the plurality of audio segments that are determined to include a speech signal.

These and other implementations can include one or more of the following features. Performing selective gain control on the stream of audio data can include adjusting the gain of the audio segments that are determined to include a speech signal without adjusting a gain of the audio segments that are determined to not include a speech signal.

Performing selective gain control on the stream of audio data can include, for each of the plurality of audio segments: selecting a set of gain control rules that indicate a manner in which a gain of the audio segment is to be adjusted or that indicate that the gain of the audio segment is not to be adjusted, wherein the set of gain control rules are selected based at least on whether the audio segment is determined to include a speech signal; and applying the selected set of gain control rules to the audio segment.

The length C of each of the plurality of audio segments can be in the range 80-120 milliseconds.

In some implementations, a computing system can include one or more processors and one or more computer-readable media. The one or more computer-readable media can have instructions stored thereon that, when executed by the one or more processors, cause performance of operations. The operations can include receiving a stream of audio data at the computing system; segmenting the stream of audio data into a plurality of audio segments of length C; determining respective intensity levels for each of the plurality of audio segments; determining, for each of the plurality of audio segments and based on the respective intensity levels, whether the audio segment includes a speech signal; and performing selective gain control on the stream of audio data by automatically adjusting a gain of particular ones of the plurality of audio segments that are determined to include a speech signal.

In some implementations, none, one or more of the following advantages may be realized. Performance of a keyword spotting model, such as one used in a hotwording or other keyword spotting system on a mobile computing device, may be improved in the presence of background noise, and in far-field conditions where the input signal is attenuated because of the distance between the speaker and the microphone. In some implementations, improved performance can be achieved by employing a combination of multi-style training and a proposed formulation of automatic gain control (AGC) that estimates the levels of both speech as well as non-speech background noise. When coupled with the use of dimensionality reduction techniques in the DNN, models can be trained with an order of magnitude fewer parameters than baseline models, while still performing competitively.

DETAILED DESCRIPTION

Figure 1:
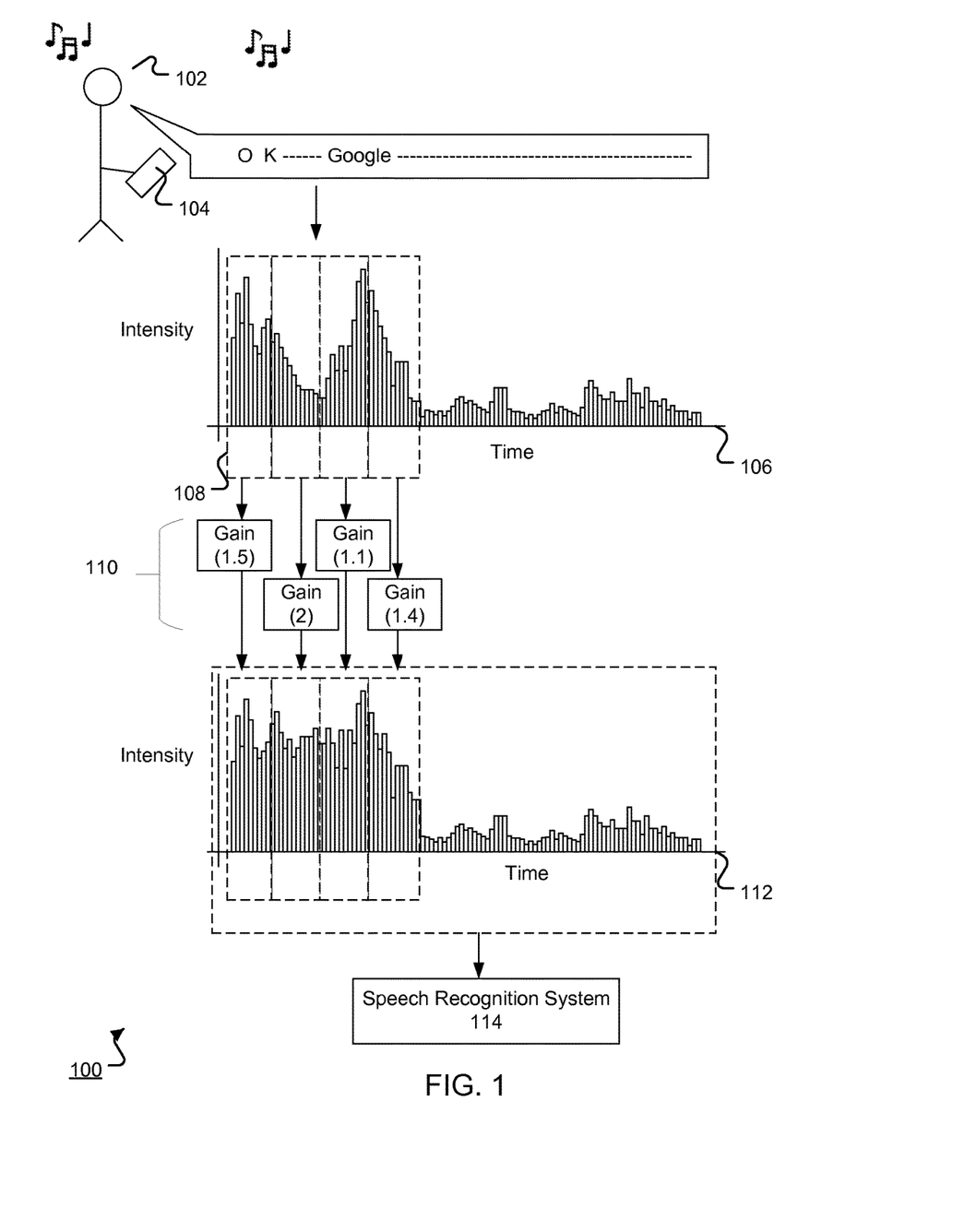
FIG. 1 is a conceptual diagram of how an audio stream is processed by an automatic gain control system.

FIG. 1 is a conceptual diagram 100 of how an audio stream is processed by an automatic gain control system. A user 102 can be in a noisy environment and state a phrase to be processed by a microphone in a mobile device 104. For example, the user 102 can verbally state the phrase "Ok Google" to alert the mobile device 104 to start processing subsequent phrases stated by the user 102.

The mobile device can include a memory, e.g., a random access memory (RAM), for storing instructions and data and a processor for executing stored instructions. The memory can include both read only and writable memory. The device can be a smartphone, tablet, or a laptop computer. The device is capable of receiving user input, e.g., through a microphone, touchscreen display, or a pointing device, e.g., a mouse or a keyboard.

The mobile device 104 can receive the phrase as an audio stream, i.e., audio data, and can represent the audio stream as a graph 106 of intensity levels over time. In some situations, the audio stream includes the phrase as well as background noise. To improve recognition of the phrase within the background noise, the automatic gain control system can segment a portion 108 of the graph into chunks. The automatic gain control system can apply a variable gain 110 across some chunks and not others to generate a modified audio stream having increased intensity levels for some chunks, which is represented by graph 112. This process will be described further below in reference to FIGS. 2-4.

The modified audio stream can be provided to a speech recognition system 114. The speech recognition system 114 can identify keywords within the modified audio stream. In some implementations, the speech recognition system 114 performs keyword spotting by determining whether the modified audio stream includes data representing a set of pre-defined keywords. The pre-defined keywords can be stored in a database of the speech recognition system 114.

In some implementations, the speech recognition system 114 uses a neural network to transcribe speech or identify keywords in the modified audio stream of audio data. The neural network can be configured to perform keyword spotting for the one or more pre-defined keywords.

The neural network can be trained by speech samples in which background noise has been added to the speech samples. For example, a noise modification system can generate background noises and overlay them onto speech samples at random intervals.

In some implementations, the automatic gain control system and the speech recognition system includes three components: (i) a feature extraction module which extracts acoustic features which are input to a neural network, (ii) a deep neural network, which computes posterior probabilities of the individual words in the keyword phrase, and (iii) a posterior handling module which combines the individual frame-level posterior scores into a single score corresponding to the keyword.

In order to detect keywords in the incoming speech at run time, the keyword detection algorithm can be performed repeatedly over sliding windows of length $T_s$ of the input speech. One such input window of length $T_s$ over the input speech is denoted as $x=\{x_1, x_2, \ldots, x_{Ts}\}$, consisting of individual frames $x_t \in R^n$ (in some implementations, these correspond to log-mel-filterbank energies, stacked together with adjacent left-and right-context frames). The keyword to be detected, w, can consists of M words, $w=\{w_1, w_2, \ldots w_M\}$. For each frame, t, in the input speech, the posterior probability of the k-th word in the keyword is denoted by $y_t(w_k)$. Smoothed posterior values, $s_t(w_i)$, can be determined by averaging the posteriors over the previous L frames, as shown below in Equation (1):

$$s_t(w_i) = \frac{1}{L} \sum_{j=t-L+1}^{t} y_t(w_i) \quad \text{Equation 1}$$

The hotword score corresponding to the sliding window, $\hat{h}(x, w)$, can be expressed as shown below in Equation (2):

$$\hat{h}(x, w) = \left[ \prod_{i=1}^{M} \max_{1 \le t \le T_s} s_t(w_i) \right]^{1/M} \quad \text{Equation 2}$$

One advantage of the hotword score in Equation 2 lies in its simplicity; the score can be computed in $\Theta(MT)$ time, and in some implementations can achieve good KWS performance. In some implementations, an alternative hotword score, $h(x, w)$, is defined according to Equation 3 below, which is generally the largest product of the smoothed posteriors in the input sliding window, subject to the constraint that the individual words 'fire' in the same order as specified in the hotword. One advantage of the hotword score $h(x, w)$ represented in Equation 3 is that the relative order in which the hotword targets are 'fired' can be accounted for.

$$h(x, w) = \left[ \max_{1 \le t_1 \le \ldots \le t_M \le T} \prod_{i=1}^{M} s_{t_i}(w_i) \right]^{1/M} \quad \text{Equation 3}$$

Although the hotword score in Equation 3 contains additional constraints, it can still be computed in $\Theta(MT)$ time using dynamic programming. In some implementations, imposing the ordering constraint in Equation 3 can reduce FAs relative to a system employing the hotword score in Equation 2. The results of the experiments described in this specification are reported with the hotword score in Equation 3.

In some implementations, in order to improve the KWS system's performance in far-field conditions in which the input signal may be attenuated because of distance between the speaker and a microphone that detects the user's speech, automatic gain control (AGC) can be employed to normalize the level of the input signal. In some implementations, the AGC techniques described in this specification can ensure that an AGC system has a small footprint on a computing device, which introduces minimal latency and improves efficiency in terms of its power consumption.

Figure 2:
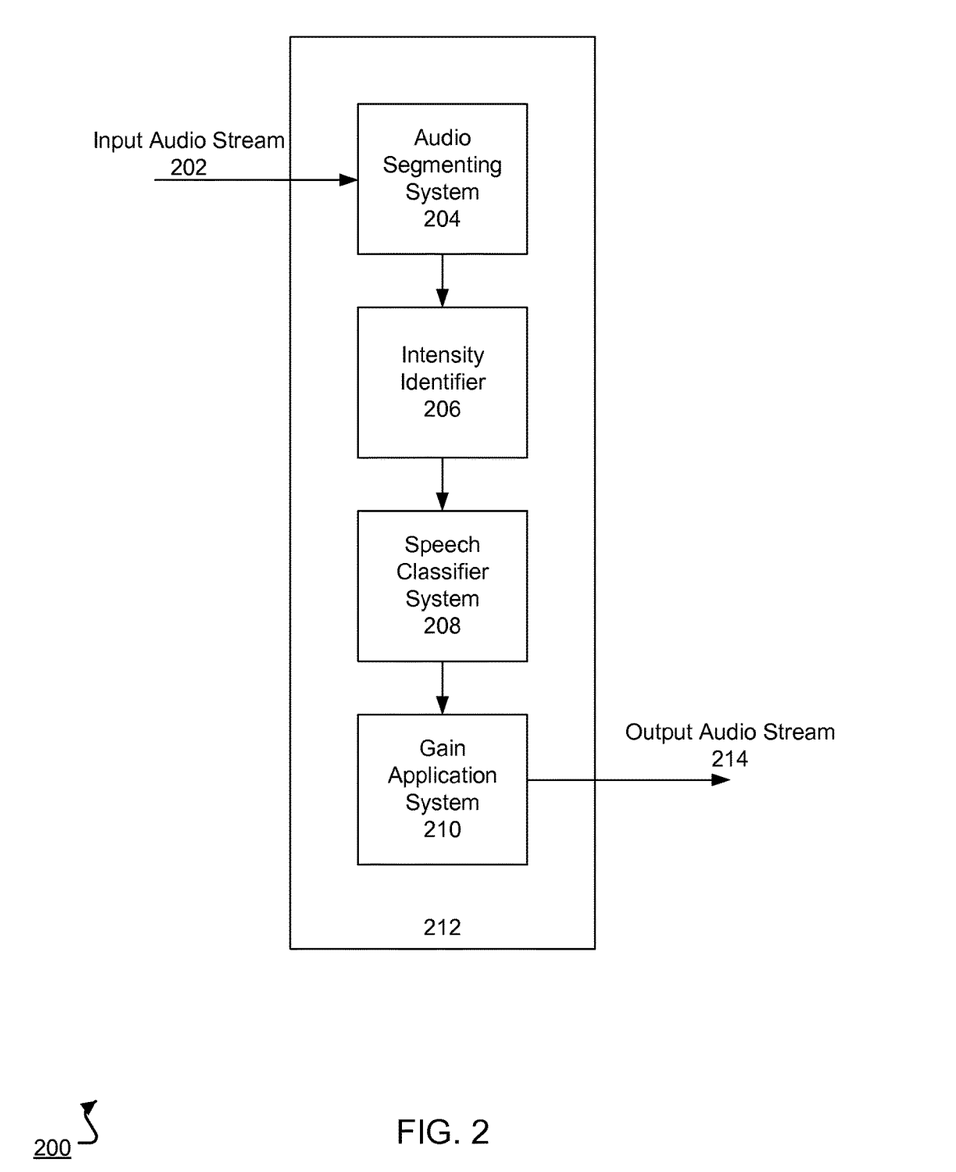
FIG. 2 is an example architecture for an automatic gain control system.

FIG. 2 is an example architecture 200 for an automatic gain control system 212. In some implementations, the automatic gain control system 212 is executed on a mobile device. The automatic gain control system 212 can receive an input audio stream 202 at an audio segmenting system 204. The audio segmenting system 204 can segment the input audio stream 202 into multiple chunks, i.e., audio segments. This will be described further below in reference to FIG. 3.

The audio segmenting system 204 can send the chunks to an intensity identifier 206. The intensity identifier 206 can identify intensity levels for each chunk, which will be described further below in reference to FIGS. 3 and 4. The intensity identifier 206 can send the identified intensity levels to a speech classifier system 208.

In some implementations, the speech classifier system 208 includes a speech classifier, which can be a model that determines whether a particular chunk is considered as speech or background noise. This will be described further below in reference to FIG. 3.

Based on the classifications from the speech classifier system 208, a gain application system 210 can apply a respective gain to each chunk. This will be described further below in reference to FIGS. 3 and 4. The gain application system 210 can generate an output audio stream 214 that is provided to a speech recognition system, e.g., the speech recognition system 114 of FIG. 1.

Figure 3:
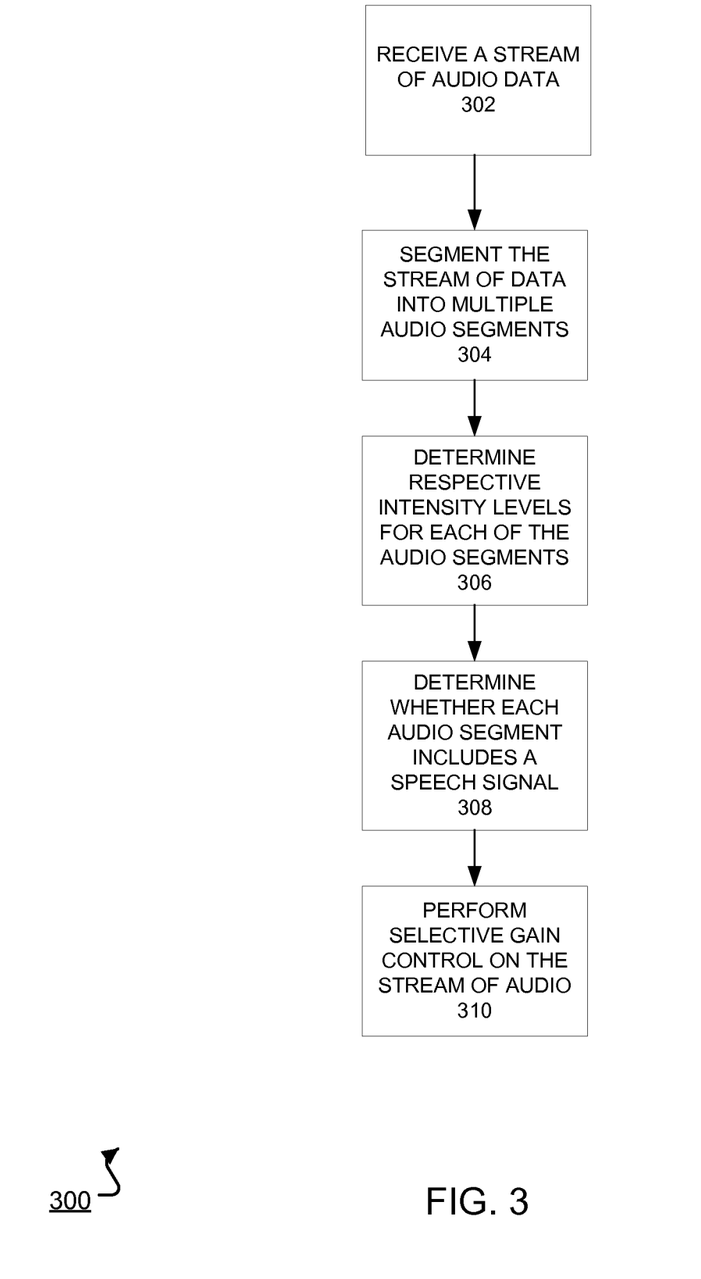
FIG. 3 is a flow diagram of an example method for performing selective gain control on an audio stream.

FIG. 3 is a flow diagram of an example method 300 for performing selective gain control on an audio stream. For convenience, the method will be described with respect to a system, e.g., the automatic gain control system 212 of FIG. 2, having one or more computing devices that execute software to implement the method 300.

The system receives a stream of audio data at a computing device (step 302). The system can receive the stream from a microphone. In some implementations, the microphone is powered to provide a constant stream of audio data, and therefore, the system is constantly receiving a stream of audio data.

The system segments the stream of audio data into multiple audio segments (step 304), e.g., using a processor. In some implementations, the system segments the stream into a pre-determined length. The predetermined length can be in the range of 80 to 120 milliseconds. In some implementations, the stream is segmented into a set of consecutive, non-overlapping segments having the pre-determined length.

The system determines respective intensity levels for each audio segment (step 306). Each audio segment can have a range of intensity levels over a duration of the segment. For example, the audio segment can have a high intensity level for a first period of time, e.g., indicating speech, and have a low intensity level, e.g., indicating background noise, for a second period of time. The system can, for each audio segment, identify a respective peak signal level from the respective range of intensity levels. In some implementations, the system identifies a median signal level. In some other implementations, the system removes outlier signal levels, e.g., using a variance parameter, and identifies a peak signal level from remaining signal levels.

The system determines, for each audio segment and based on the respective intensity levels, whether the audio segment includes a speech signal or background noise (step 308). For example, the system can apply a trained speech classifier to a particular audio segment. In some implementations, for each audio segment, the system determines means and standard deviations parameters from the respective intensity level of the audio segment, which will be described below. The system can generate a classification from the means and standard deviations parameters and from speech and background models, which will also be described below. The classification can indicate whether the audio segment includes a speech signal. After classifying the audio segment, the system can incorporate the means and standard deviations parameters into the model corresponding to the classification. For example, if the audio segment is classified to having a speech signal, the system can incorporate the means and standard deviations parameters into the speech model, thereby updating the speech model for subsequent audio segments.

In order to distinguish portions of the sound signal corresponding to input speech, two probabilistic classes of peak sound levels can be estimated: (1) the signal S corresponding to input speech, and the non-signal floor B, corresponding to background where no speech is present. In this manner, only those chunks that are likely to contain speech can be selectively gained up, without boosting background noise.

In some AGC implementations, the input time-domain signal can be segmented into non-overlapping chunks of audio samples of a defined length (e.g., 100 ms). The peak signal level, l, of each of these chunk is identified. The peak-level of audio chunks can be modeled as being generated from a mixture of two Gaussians: corresponding to speech is $l_S \sim N(\mu S, \sigma S)$ and the non-speech background $l_B \sim N(\mu B, \sigma B)$. Using relatively large (e.g., 100 ms) non-overlapping chunks permits the assumption that individual peak chunk-levels are independent. In some implementations, the peak signal level of the chunks is advantageous as an indicator of the strength of the dominant source in the chunk (e.g., 90 ms of quiet speech and 10 ms of loud speech can still count as containing loud speech). In some implementations, other signal levels can be identified or computed for each chunk, such as the mean or root mean square signal level, and used as the signal level l.

Unknown model parameters, including the means ($\mu S$, $\mu B$) and standard deviations ($\sigma S$, $\sigma B$), can be estimated using one or more techniques, such as the Expectation-Maximization algorithm (e.g., "hard"-EM), with modifications for efficient real-time updates. By way of illustration, first, given current model estimates, a new signal level, l, can be classified as either arising from S or B, using a simplified maximum-likelihood hypothesis testing. Then, once a chunk has been classified as either speech or background, the model parameters can be updated for the respective class. For GMMs, sample means and variances can be computed for each class. In order to do this in real time, without using additional memory, exponentially-weighted "moving averages" of the sample means ($\mu \leftarrow \kappa_\mu l + (1-\kappa_\mu)\mu$) and variances ($\sigma^2 \leftarrow \kappa_\sigma (l-\mu)^2 + (1-\kappa_\sigma)\sigma^2$), respectively, can be recursively computed.

Maximum-Likilihood Hypothesis Testing. In order to classify the measured signal level, l, the likelihood ratio, R, can be determined to compare likelihoods of it belonging to the two classes, which can be expressed as shown below in Equation (4):

$$R = \frac{p(l|S)}{p(l|\mathcal{B})} = \frac{\sigma_\mathcal{B}}{\sigma_S} \exp\left(\frac{-0.5}{z_S^2 - z_\mathcal{B}^2}\right) \quad \text{Equation 4}$$

Where $z_S$ and $Z_B$ are z-scores can be expressed as shown below in Equation (5), $$z_S = \frac{l - \mu_S}{\sigma_S} \quad \text{Equation 5}$$

$$z_\mathcal{B} = \frac{l - \mu_\mathcal{B}}{\sigma_\mathcal{B}}$$

Thus, $$R > 1 \iff z_S^2 - z_\mathcal{B}^2 < -2 \ln\left(\frac{\sigma_S}{\sigma_\mathcal{B}}\right).$$

A further simplifying approximation can be made that $\sigma_S \approx \sigma_B$, so that, a final classification rule can be expressed as shown below in Equation (6):

$$\text{classification}(l) = \begin{cases} S, & \text{if } z_S^2 < z_\mathcal{B}^2 \\ \mathcal{B}, & \text{otherwise} \end{cases} \quad \text{Equation 6}$$

In some implementations, model estimates can be 'decayed' in order to mediate certain undesirable effects of incorrect classification, e.g., if either us or $\sigma_S$ or $\sigma_B$ (denoted by $\sigma_X$ in Equation 7, below) becomes too concentrated, new points will be unlikely to fall be classified into its class, and the model may not adapt. This can be achieved by slowly increasing the variance of both models with each iteration, to model growth of uncertainty over time. This can be represented in Equation 7:

$$\text{if} \quad \sigma_X^2 < \tau^2 \quad \text{Equation 7}$$

$$\text{then}$$

$$\sigma_X^2 \leftarrow \sigma_X^2 + \frac{\sigma_S^2 + \sigma_\mathcal{B}^2}{2\delta}$$

The system performs selective gain control on the stream of audio data (step 310). The system can adjust a respective gain of particular audio segments that are determined to include a speech signal. That is, if an audio segment is determined to include a speech signal, the system can generate a gain to be applied to the audio segment. If the audio segment is determined not to include a speech signal, the system can proceed to process a subsequent audio segment, or the system can apply a fractional or negative gain to the audio segment.

In some implementations, the system determines how much gain to be applied to an audio segment based on a set of gain control rules. By way of illustration, the set of gain control rules can be as follows: if a signal chunk is classified as S, i.e. a speech signal, then the input signal can be gained as appropriate to normalize the estimated signal level as represented in Equation 8. In some implementations, if the signal chunk is classified as S, the input signal may be gained only if the classification or estimates are made with sufficient confidence, such as if the signal and noise estimates are well-separated (e.g., $\mu S - \mu B > \sigma S + \sigma B$). Some experiments have shown $\Theta = 0.8$ to be effective by tuning on a development set.

$$\text{gain} = \frac{\theta}{\mu_S + \sigma_S} \quad \text{Equation 8}$$

If the signal and noise estimates are not well-separated, a conservative gain strategy can be employed, as represented in Equation 9:

$$\text{gain} = \frac{\theta'}{\min\{\mu_S + \sigma_S, \mu_\mathcal{B} + \sigma_\mathcal{B}\}} \quad \text{Equation 9}$$

The gain can be applied to scale up the input signal smoothly across chunks (the signal may not be attenuated), while ensuring that no clipping occurs.

Figure 4:
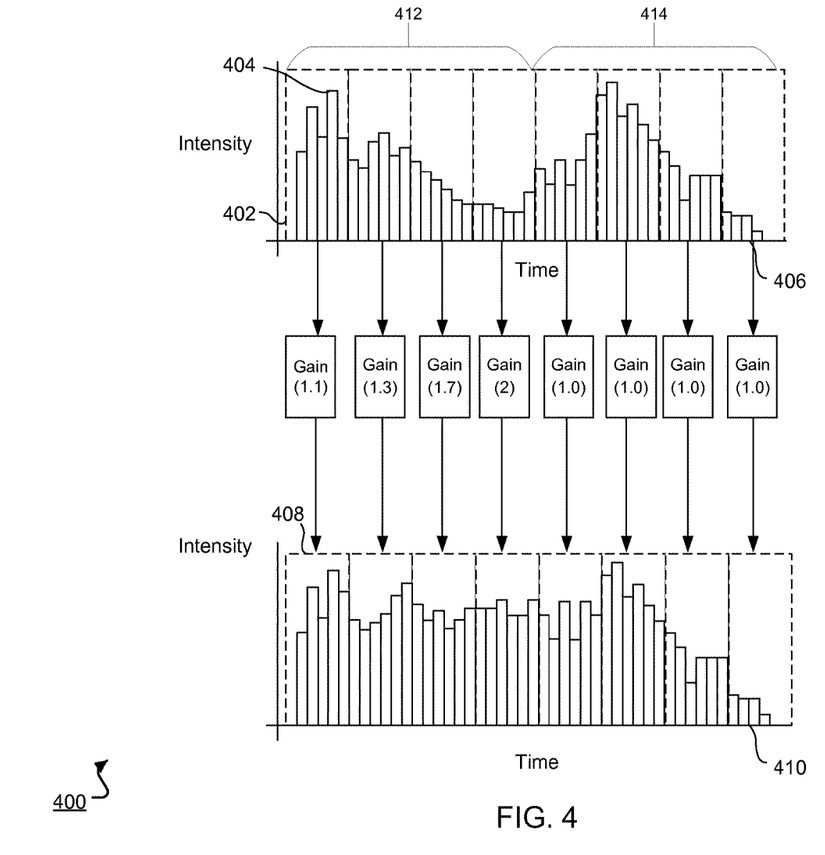
FIG. 4 is a conceptual diagram of selectively modifying an audio stream based on intensity levels.

FIG. 4 is a conceptual diagram 400 of selectively modifying an audio stream based on intensity levels. By way of illustration, the system can determine that audio segments 412 include speech signals and that audio segments 414 do not include speech signals. For example, the system can process audio segment 402 and identify a peak intensity level 404. The system can use the peak intensity level 404 to determine, through speech and background models, the audio segment 402 includes speech. The system can generate a gain to be applied to the audio segment, e.g., Gain (1.1) using methods described above in reference to FIG. 3. Similarly, the system can identify a peak level of audio segment 406 and determine the audio segment 406 does not include a speech signal. Therefore, the system can, when generating a modified audio segment, leave the audio segment 410 unchanged, e.g., by applying a gain of 1.0, from the original audio segment 406.

The following description describes additional technical subject matter related to the automatic gain control system.

Experiments have been performed using the techniques discussed in this specification. In some implementations, the experiments are performed with feed-forward DNN systems, fully connected neural networks, with three hidden layers and a softmax output layer. The softmax output layer can contain one output target for each of the words in the keyword phrase to be detected, plus an additional output target (e.g., single output target) which represents all frames that do not belong to any of the words in the keyword as shown in FIG. 1. The (word) label for each input acoustic frame of the training utterances can be determined by forced-alignment using a large vocabulary speech recognition system (LVCSR system). Rectified linear unit (ReLU) activation functions can be used for the hidden layer nodes. The input to the DNN can include log-mel-filterbank energies (computed over 25 ms of speech, with a 10 ms frame-shift, for example), stacked together with left- and right-contextual frames. Since each additional frame of right-context adds an additional 10 ms of latency to the system, a larger number of left contextual frames are used than right contextual frames. The acoustic feature extraction module and the DNN runtime-engine are both implemented in these example experiments using fixed-point arithmetic in order to minimize power consumption. The network weights and biases are then trained to optimize a cross-entropy criterion with asynchronous gradient descent implemented using the large-scale distributed neural network training infrastructure.

In order to validate the proposed approach in these example experiments, fifteen keyword phrases were selected, and approximately 10K-15K utterances were collected containing these phrases. A much larger set of approximately 396K utterances was also collected, which do not contain any of the keywords and are thus used as negative training data. The utterances were then randomly split into training, development and test sets in the ratio 80:5:15, respectively. A much larger set of approximately 100K speech utterances was collected from voice search logs to use as an additional development set; a system threshold was selected to correspond to 1 FA per hour of speech on this set. Two types of additional noisy data were further collected to represent two common use-cases for our proposed system: cafeteria noise, consisting mostly of background speech, occasionally mixed in with some music, and a dataset of car noise collected in various conditions (e.g., window cracked open, radio playing, air-conditioner on, etc.). The collected noise sources were separated into separate training/development and evaluation portions.

Noisy training and evaluation sets were created in these example experiments by artificially adding in car and cafeteria noise at various SNRs. Noisy training data can be created by adding a random snippet of car or cafeteria noise to the utterances in the training set at an SNR randomly sampled, for example, between [−5 db, +10 db]. In addition to a clean evaluation set, consisting of the utterances containing a given hotword and the large set of 'negative' utterances, noisy versions of the clean evaluation set can also be created by adding in car noise added in at −5 db (car_−5 db), and cafeteria noise at 3 db (cafe 3 db), respectively. One use case is one in which the user is driving. Far-field versions of the clean and car_−5 db evaluations sets can be created by simulating a distance of 100 cm between the speaker and microphone (clean_100 cm, car_−5 db_100 cm, respectively).

A first set of experiments was aimed at determining the impact of multistyle-training and AGC on system performance. A baseline DNN system (baseline) in this set of example experiments employs 3 hidden layers of 128 nodes each. The input to the net consists of 40 dimensional logmel-filterbank energies with 30 frames of left-context and 10 frames of right-context as input to the net. The KWS detection algorithm described in this specification is performed over sliding windows of 100 frames ($T_s$=100), with the posterior smoothing window set to 30 frames (L=30). Performance of the baseline system is compared against a system trained with multisyle training (MS), with AGC turned on during evaluation (AGC) or both (MS+AGC). ROC curves comparing the systems are presented in FIG. 2. Results are presented at the chosen operating point of 1 FA per hour on the dev-voice search set in Table 1. Since FA rates are consistently low across all of our systems and evaluation sets, ranging from 0.04%-0.07%, we only report FR rates are reported in Table 1 (FA rates were generally low across systems and evaluation sets, ranging from 0.04%-0.07%). As can be seen in Table 1, there is a significant degradation in performance on the noisy and far-field evaluation sets, relative to the clean set. The use of multi-style training consistently improves performance over the baseline system in all evaluation sets, although the gains are relatively small. Using AGC alone, however, produces large gains on the far-field datasets, but produces worse performance in the noisy evaluation sets. Using a combination of AGC and multi-style training, improves performance over using multi-style training alone, achieving large gains in clean and far-field conditions (both noisy and clean), although there is some performance degradation in the noisy sets. Overall, a combination of multi-style training and AGC resulted in the best combination of performance averaged over all of the evaluation sets.

TABLE 1

False reject (FR) rates averaged across all the phrases, corresponding to an operating point of 1 FA per hour on the dev-voicesearch set.

| System | baseline | MS | AGC | MS + AGC |
|---|---|---|---|---|
| clean | 6.63% | 6.48% | 5.75% | 4.93% |
| car_−5 dB | 8.85% | 7.87% | 12.85% | 9.79% |
| cafe_5 db | 11.55% | 8.83% | 22.51% | 16.04% |
| clean-100 cm | 47.33% | 46.61% | 11.47% | 10.98% |
| car_−5 db-100 cm | 47.86% | 46.97% | 12.44% | 10.31% |
| average | 24.44% | 23.35% | 13.04% | 10.41% |

In a second set of experiments, low-rank DNN layers were employed to reduce the KWS model size. Due to the constraints of mobile devices, it is desired to minimize the size of DNN models, because fewer model parameters may demand less CPU usage and lower power consumption. For example, in the experiments discussed above, more than 85% of the total parameters of the baseline model were present between the input and the hidden layer, due to the relatively larger input feature dimension.

In the second set of experiments, an examination was made of how performance varies as a function of model size. The experiments evaluated whether competitive performance could be achieved while reducing model size by an order of magnitude.

The number of model parameters in the system can be reduced relative to the baseline presented in the first set of experiments discussed above (e.g., Table 1) by using fewer mel-filterbanks (25, instead of 40), lower left- and right-contextual frames (25, and 3 instead of 30, and 10 respectively). Parameters can be reduced further by changing the number of nodes in the hidden layer as well. Two techniques are considered for doing this: a first system (baseline-40k) uses three hidden layers with 64 hidden nodes in each, and thus contains about 40K parameters, as opposed to the baseline discussed above which contained 240K parameters.

As a second approach to reducing the number of nodes in the DNN, a dimensionality reduction low-rank layer can be learned jointly with the rest of the neural network. The low-rank layer can be applied on the input side. For example, they system can employ a linear low-rank layer with 32 hidden nodes in this first layer, and 128 nodes in the other two layers, so that the total number of parameters is about 47K. In some implementations, it is advantageous to use linear activation functions for the low-rank layer, with ReLU activation functions for the nodes in the other two hidden layers. The low-rank layer can be applied to the input features of the neural network.

Table 2 shows performance of the KWS systems averaged across all of the KWS phrases in the example experimental dataset, where the operating point is chosen to correspond to 1 FA per hour on the devvoice search set. Performance for these systems with AGC and multi-style training is shown in Table 2. As before, results of the experiment showed that FA performance across all systems and evaluation sets is very comparable, ranging from about 0.04%-0.08%. Therefore, only FR rates are shown in the table.

TABLE 2

False reject (FR) rates averaged across all the phrases, corresponding to an operating point of 1 FA per hour on the dev-voicesearch set. All systems in this table are use a combination of multi-style training and AGC.

| System | baseline + MS + AGC | small + MS + AGC | low-rank + MS + AGC |
| --- | --- | --- | --- |
| clean | 4.93% | | 8.32% |
| car_-5 dB | 12.33% | | 19.38% |
| cafe_5 db | 16.04% | | 24.89% |
| clean-100 cm | 10.98% | | 17.32% |
| car_-5 db-100 cm | 10.31% | | 16.99% |
| average | 10.41% | | 17.38% |

The FA rates of the smaller DNN models are degraded from the baseline model by a factor of about 1.8×. However, the large savings in terms of model size (about 8×), allows these models to be deployed on lower-resource devices with low memory and power consumption.

Figure 5:
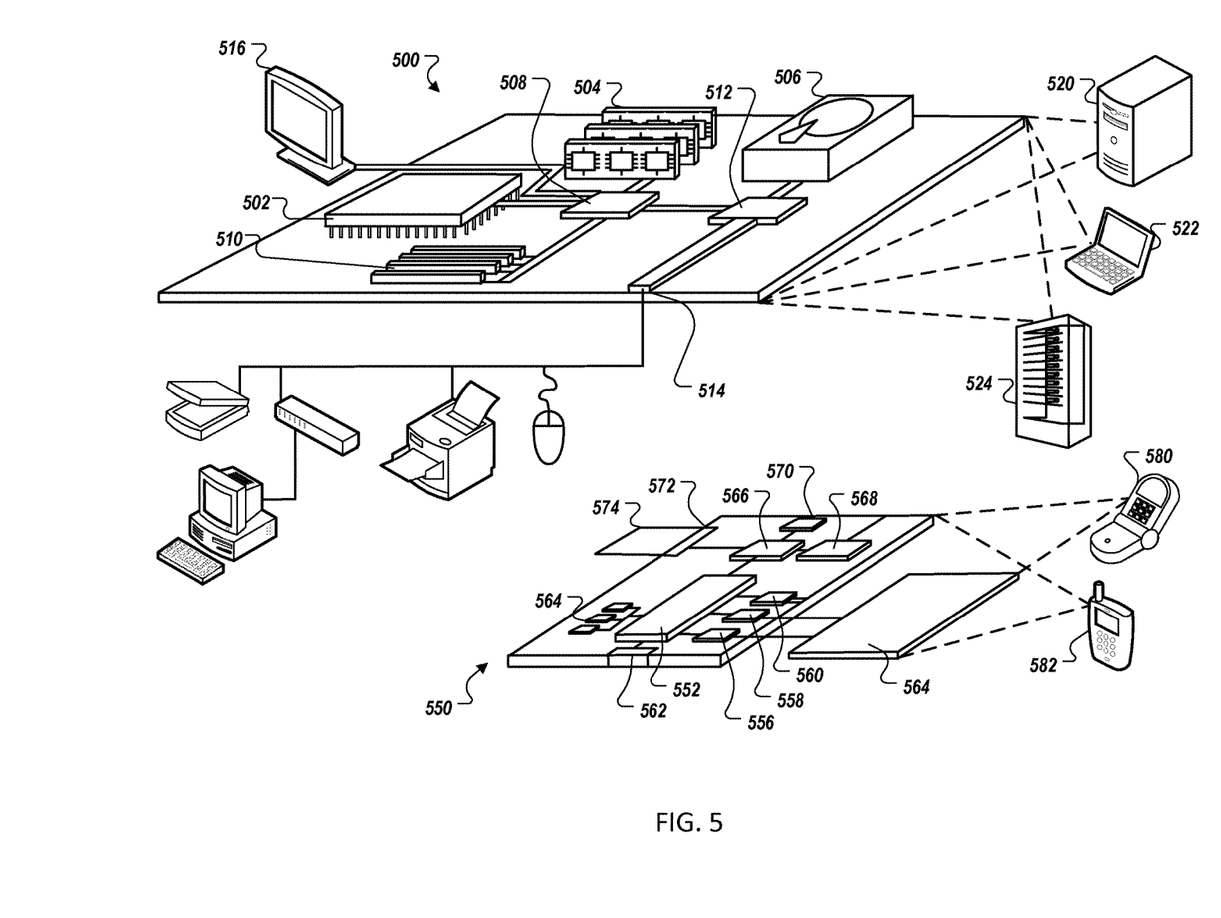
FIG. 5 depicts an example of a computing device and a mobile computing device that can be used to implement the techniques described in this specification.

FIG. 5 shows an example of a computing device 500 and a mobile computing device that can be used to implement the techniques described herein. The computing device 500 is intended to represent various forms of digital computers, such as laptops, desktops, workstations, personal digital assistants, servers, blade servers, mainframes, and other appropriate computers. The mobile computing device is intended to represent various forms of mobile devices, such as personal digital assistants, cellular telephones, smartphones, and other similar computing devices. The components shown here, their connections and relationships, and their functions, are meant to be exemplary only, and are not meant to limit implementations of the inventions described and/or claimed in this specification.

The computing device 500 includes a processor 502, a memory 504, a storage device 506, a high-speed interface 508 connecting to the memory 504 and multiple high-speed expansion ports 510, and a low-speed interface 512 connecting to a low-speed expansion port 514 and the storage device 506. Each of the processor 502, the memory 504, the storage device 506, the high-speed interface 508, the high-speed expansion ports 510, and the low-speed interface 512, are interconnected using various busses, and may be mounted on a common motherboard or in other manners as appropriate. The processor 502 can process instructions for execution within the computing device 500, including instructions stored in the memory 504 or on the storage device 506 to display graphical information for a GUI on an external input/output device, such as a display 516 coupled to the high-speed interface 508. In other implementations, multiple processors and/or multiple buses may be used, as appropriate, along with multiple memories and types of memory. Also, multiple computing devices may be connected, with each device providing portions of the necessary operations (e.g., as a server bank, a group of blade servers, or a multi-processor system).

The memory 504 stores information within the computing device 500. In some implementations, the memory 504 is a volatile memory unit or units. In some implementations, the memory 504 is a non-volatile memory unit or units. The memory 304 may also be another form of computer-readable medium, such as a magnetic or optical disk.

The storage device 506 is capable of providing mass storage for the computing device 500. In some implementations, the storage device 506 may be or contain a computer-readable medium, such as a floppy disk device, a hard disk device, an optical disk device, or a tape device, a flash memory or other similar solid state memory device, or an array of devices, including devices in a storage area network or other configurations. The computer program product may also contain instructions that, when executed, perform one or more methods, such as those described above. The computer program product can also be tangibly embodied in a computer- or machine-readable medium, such as the memory 504, the storage device 506, or memory on the processor 502.

The high-speed interface 508 manages bandwidth-intensive operations for the computing device 500, while the low-speed interface 512 manages lower bandwidth-intensive operations. Such allocation of functions is exemplary only. In some implementations, the high-speed interface 508 is coupled to the memory 504, the display 516 (e.g., through a graphics processor or accelerator), and to the high-speed expansion ports 510, which may accept various expansion cards (not shown). In the implementation, the low-speed interface 512 is coupled to the storage device 506 and the low-speed expansion port 514. The low-speed expansion port 514, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 500 may be implemented in a number of different forms, as shown in the figure. For example, it may be implemented as a standard server 520, or multiple times in a group of such servers. In addition, it may be implemented in a personal computer such as a laptop computer 522. It may also be implemented as part of a rack server system 524. Alternatively, components from the computing device 500 may be combined with other components in a mobile device (not shown), such as a mobile computing device 550. Each of such devices may contain one or more of the computing device 500 and the mobile computing device 550, and an entire system may be made up of multiple computing devices communicating with each other.

The mobile computing device 550 includes a processor 552, a memory 564, an input/output device such as a display 554, a communication interface 566, and a transceiver 568, among other components. The mobile computing device 550 may also be provided with a storage device, such as a micro-drive or other device, to provide additional storage. Each of the processor 552, the memory 564, the display 554, the communication interface 566, and the transceiver 568, are interconnected using various buses, and several of the components may be mounted on a common motherboard or in other manners as appropriate.

The processor 552 can execute instructions within the mobile computing device 550, including instructions stored in the memory 564. The processor 552 may be implemented as a chipset of chips that include separate and multiple analog and digital processors. The processor 552 may provide, for example, for coordination of the other components of the mobile computing device 550, such as control of user interfaces, applications run by the mobile computing device 550, and wireless communication by the mobile computing device 550.

The processor 552 may communicate with a user through a control interface 558 and a display interface 556 coupled to the display 554. The display 554 may be, for example, a TFT (Thin-Film-Transistor Liquid Crystal Display) display or an OLED (Organic Light Emitting Diode) display, or other appropriate display technology. The display interface 556 may comprise appropriate circuitry for driving the display 554 to present graphical and other information to a user. The control interface 558 may receive commands from a user and convert them for submission to the processor 552. In addition, an external interface 562 may provide communication with the processor 552, so as to enable near area communication of the mobile computing device 550 with other devices. The external interface 562 may provide, for example, for wired communication in some implementations, or for wireless communication in other implementations, and multiple interfaces may also be used.

The memory 564 stores information within the mobile computing device 550. The memory 564 can be implemented as one or more of a computer-readable medium or media, a volatile memory unit or units, or a non-volatile memory unit or units. An expansion memory 574 may also be provided and connected to the mobile computing device 550 through an expansion interface 572, which may include, for example, a SIMM (Single In Line Memory Module) card interface. The expansion memory 574 may provide extra storage space for the mobile computing device 550, or may also store applications or other information for the mobile computing device 550. Specifically, the expansion memory 574 may include instructions to carry out or supplement the processes described above, and may include secure information also. Thus, for example, the expansion memory 574 may be provide as a security module for the mobile computing device 550, and may be programmed with instructions that permit secure use of the mobile computing device 550. In addition, secure applications may be provided via the SIMM cards, along with additional information, such as placing identifying information on the SIMM card in a non-hackable manner.

The memory may include, for example, flash memory and/or NVRAM memory (non-volatile random access memory), as discussed below. The computer program product contains instructions that, when executed, perform one or more methods, such as those described above. The computer program product can be a computer- or machine-readable medium, such as the memory 564, the expansion memory 574, or memory on the processor 552. In some implementations, the computer program product can be received in a propagated signal, for example, over the transceiver 568 or the external interface 562.

The mobile computing device 550 may communicate wirelessly through the communication interface 566, which may include digital signal processing circuitry where necessary. The communication interface 566 may provide for communications under various modes or protocols, such as GSM voice calls (Global System for Mobile communications), SMS (Short Message Service), EMS (Enhanced Messaging Service), or MMS messaging (Multimedia Messaging Service), CDMA (code division multiple access), TDMA (time division multiple access), PDC (Personal Digital Cellular), WCDMA (Wideband Code Division Multiple Access), CDMA2000, or GPRS (General Packet Radio Service), among others. Such communication may occur, for example, through the transceiver 568 using a radio-frequency. In addition, short-range communication may occur, such as using a Bluetooth, WiFi, or other such transceiver (not shown). In addition, a GPS (Global Positioning System) receiver module 570 may provide additional navigation- and location-related wireless data to the mobile computing device 550, which may be used as appropriate by applications running on the mobile computing device 550.

The mobile computing device 550 may also communicate audibly using an audio codec 560, which may receive spoken information from a user and convert it to usable digital information. The audio codec 560 may likewise generate audible sound for a user, such as through a speaker, e.g., in a handset of the mobile computing device 550. Such sound may include sound from voice telephone calls, may include recorded sound (e.g., voice messages, music files, etc.) and may also include sound generated by applications operating on the mobile computing device 550.

The mobile computing device 550 may be implemented in a number of different forms, as shown in the figure. For example, it may be implemented as a cellular telephone 580. It may also be implemented as part of a smart-phone 382, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms machine-readable medium and computer-readable medium refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term machine-readable signal refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network (LAN), a wide area network (WAN), and the Internet.

The computing system can include clients and servers. A client and server are generally remote from each other and typically interact through a communication network. The relationship of client and server arises by virtue of computer programs running on the respective computers and having a client-server relationship to each other.

Although various implementations have been described in detail above, other modifications are possible. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A computer-implemented method, comprising:
    receiving a stream of audio data at a computing device;
    segmenting the stream of audio data into a plurality of audio segments;
    determining respective intensity levels for each of the plurality of audio segments, comprising, for each of the plurality of audio segments, designating a peak signal level of the audio segment as the intensity level of the audio segment;
    in response to determining respective intensity levels for each of the plurality of audio segments, which comprises designating a peak signal level of the audio segment as the intensity level of the audio segment, determining, based on the respective intensity levels, whether each of the audio segments includes a speech signal;
    performing selective gain control on the stream of audio data by adjusting a respective gain of particular ones of the plurality of audio segments that are determined to include a speech signal,
    wherein the respective intensity levels for each of the plurality of audio segments are determined prior to adjusting the respective gain of particular ones of the plurality of audio segments;
    performing speech recognition, by a speech recognition engine, on at least a portion of the selectively gain controlled stream of audio data; and
    determining whether the portion of the selectively gain controlled stream of audio data includes speech for one or more of a plurality of pre-defined keywords based on the speech recognition performed, by the speech recognition engine, on at least a portion of the selectively gain controlled stream of audio data.

2. The computer-implemented method of claim 1, wherein performing selective gain control on the stream of audio data comprises adjusting the respective gain of the audio segments that are determined to include a speech signal without adjusting a gain of the audio segments that are determined to not include a speech signal.

3. The computer-implemented method of claim 1, wherein performing the selective gain control on the stream of audio data comprises, for each of the plurality of audio segments:
    selecting a set of gain control rules that indicate a manner in which a gain of the audio segment is to be adjusted or that indicate that the gain of the audio segment is not to be adjusted, wherein the set of gain control rules are selected based at least on whether the audio segment is determined to include a speech signal; and
    applying the selected set of gain control rules to the audio segment.

4. The computer-implemented method of claim 1, wherein each segment has a length C in the range 80-120 milliseconds.

5. The computer-implemented method of claim 1, wherein segmenting the stream of audio data into the plurality of audio segments comprises segmenting the stream of audio data into a plurality of consecutive, non-overlapping segments of audio data of uniform length.

6. The computer-implemented method of claim 1, wherein determining whether each of the plurality of audio segments includes a speech signal comprises using the respective intensity level for each audio segment to differentiate among audio segments that include only noise and audio segments that include speech.

7. The computer-implemented method of claim 1, wherein the portion of the selectively gain controlled stream of audio data comprises audio segments that are determined to include a speech signal.

8. The computer-implemented method of claim 1, wherein performing speech recognition comprises using a neural network to transcribe speech in the portion of the selectively gain controlled stream of audio data, or to identify that one or more pre-defined keywords are included in speech in the portion of the selectively gain controlled stream of audio data.

9. The computer-implemented method of claim 8, wherein the neural network is configured to perform keyword spotting for the one or more pre-defined keywords, and wherein the neural network was trained at least in part on speech samples in which background noise has been added to the speech samples.

10. The computer-implemented method of claim 8, wherein the neural network comprises a low-rank input layer.

11. The computer-implemented method of claim 1, wherein the computing device comprises a smartphone, a tablet computing device, a desktop computer, or a notebook computer.

12. The computer-implemented method of claim 1, wherein determining whether each of the plurality of audio segments includes a speech signal comprises, for each audio segment:
  determining means and standard deviations parameters from the respective intensity level of the audio segment;
  generating a classification of the audio segment as a speech signal or a background signal based at least on the means and standard deviations parameters using respective speech and background models;
  incorporating the means and standard deviations parameters into (i) the speech model based on the classification of the audio segment being a speech signal or (ii) the background model based on the classification of the audio segment being a background signal; and
  determining whether the audio segment includes a speech signal from the classification.

13. One or more non-transitory computer-readable storage media having instructions stored thereon that, when executed by one or more processors, cause performance of operations comprising:
  receiving a stream of audio data at a computing device;
  segmenting the stream of audio data into a plurality of audio segments;
  determining respective intensity levels for each of the plurality of audio segments, comprising, for each of the plurality of audio segments, designating a peak signal level of the audio segment as the intensity level of the audio segment;
  in response to determining respective intensity levels for each of the plurality of audio segments, which comprises designating a peak signal level of the audio segment as the intensity level of the audio segment, determining, based on the respective intensity levels, whether each of the audio segments includes a speech signal;
  performing selective gain control on the stream of audio data by adjusting a respective gain of particular ones of the plurality of audio segments that are determined to include a speech signal,
  wherein the respective intensity levels for each of the plurality of audio segments are determined prior to adjusting the respective gain of particular ones of the plurality of audio segments;
  performing speech recognition, by a speech recognition engine, on at least a portion of the selectively gain controlled stream of audio data; and
  determining whether the portion of the selectively gain controlled stream of audio data includes speech for one or more of a plurality of pre-defined keywords based on the speech recognition performed, by the speech recognition engine, on at least a portion of the selectively gain controlled stream of audio data.

14. The computer-readable storage media of claim 13, wherein performing selective gain control on the stream of audio data comprises adjusting the gain of the audio segments that are determined to include a speech signal without adjusting a gain of the audio segments that are determined to not include a speech signal.

15. The computer-readable storage media of claim 13, wherein performing the selective gain control on the stream of audio data comprises, for each of the plurality of audio segments:
  selecting a set of gain control rules that indicate a manner in which a gain of the audio segment is to be adjusted or that indicate that the gain of the audio segment is not to be adjusted, wherein the set of gain control rules are selected based at least on whether the audio segment is determined to include a speech signal; and
  applying the selected set of gain control rules to the audio segment.

16. The computer-readable storage media of claim 13, wherein performing speech recognition comprises using a neural network to transcribe speech in the portion of the selectively gain controlled stream of audio data, or to identify that one or more pre-defined keywords are included in speech in the portion of the selectively gain controlled stream of audio data.

17. The computer-readable storage media of claim 13, wherein the neural network is configured to perform keyword spotting for the one or more pre-defined keywords, and wherein the neural network was trained at least in part on speech samples in which background noise has been added to the speech samples.

18. A computing system, comprising:
  one or more processors; and
  one or more computer-readable media having instructions stored thereon that, when executed by the one or more processors, cause performance of operations comprising:
    receiving a stream of audio data at a computing device;
    segmenting the stream of audio data into a plurality of audio segments;
    determining respective intensity levels for each of the plurality of audio segments, comprising, for each of the plurality of audio segments, designating a peak signal level of the audio segment as the intensity level of the audio segment;
    in response to determining respective intensity levels for each of the plurality of audio segments, which comprises designating a peak signal level of the audio segment as the intensity level of the audio segment, determining, based on the respective intensity levels, whether each of the audio segments includes a speech signal;
    performing selective gain control on the stream of audio data by adjusting a respective gain of particular ones of the plurality of audio segments that are determined to include a speech signal,
    wherein the respective intensity levels for each of the plurality of audio segments are determined prior to adjusting the respective gain of particular ones of the plurality of audio segments;
    performing speech recognition, by a speech recognition engine, on at least a portion of the selectively gain controlled stream of audio data; and
    determining whether the portion of the selectively gain controlled stream of audio data includes speech for one or more of a plurality of pre-defined keywords based on the speech recognition performed, by the speech recognition engine, on at least a portion of the selectively gain controlled stream of audio data.

19. The system of claim 18, wherein performing selective gain control on the stream of audio data comprises adjusting the gain of the audio segments that are determined to include a speech signal without adjusting a gain of the audio segments that are determined to not include a speech signal.

20. The system of claim 18, wherein performing speech recognition comprises using a neural network to transcribe speech in the portion of the selectively gain controlled stream of audio data, or to identify that one or more pre-defined keywords are included in speech in the portion of the selectively gain controlled stream of audio data; and
    wherein the neural network is configured to perform keyword spotting for the one or more pre-defined keywords, and wherein the neural network was trained at least in part on speech samples in which background noise has been added to the speech samples.

* * * * *